(12) United States Patent
Hsu

(10) Patent No.: US 10,734,088 B2
(45) Date of Patent: *Aug. 4, 2020

(54) CMOS ANTI-FUSE CELL

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/551,569

(22) Filed: Aug. 26, 2019

(65) Prior Publication Data

US 2019/0378584 A1 Dec. 12, 2019

Related U.S. Application Data

(63) Continuation of application No. 16/143,346, filed on Sep. 26, 2018, now Pat. No. 10,395,744, which is a
(Continued)

(51) Int. Cl.
*G11C 17/16* (2006.01)
*H01L 23/525* (2006.01)
*H01L 27/112* (2006.01)
*G11C 17/18* (2006.01)
(Continued)

(52) U.S. Cl.
CPC .............. *G11C 17/16* (2013.01); *G11C 17/18* (2013.01); *H01L 23/5252* (2013.01);
(Continued)

(58) Field of Classification Search
CPC ...................................................... G11C 17/18
(Continued)

(56) References Cited

U.S. PATENT DOCUMENTS 9,793,001 B2 * 10/2017 Hsu ..................... G11C 17/16
2003/0173630 A1 9/2003 Lin et al.
(Continued)

FOREIGN PATENT DOCUMENTS

CN 101807580 A 8/2010
CN 102867829 A 1/2013

OTHER PUBLICATIONS

International Search Report, dated Jul. 22, 2016, for corresponding International Application No. PCT/US2016/026986.
(Continued)

*Primary Examiner* — Hoai V Ho
*Assistant Examiner* — Muna A Techane
(74) *Attorney, Agent, or Firm* — Intellectual Property Law Group LLP

(57) ABSTRACT

A CMOS anti-fuse cell is disclosed. In one aspect, an apparatus includes an N– well and an anti-fuse cell formed on the N– well. The anti-fuse cell includes a drain P+ diffusion deposited in the N– well, a source P+ diffusion deposited in the N– well, and an oxide layer deposited on the N– well and having an overlapping region that overlaps the drain P+ diffusion. A control gate is deposited on the oxide layer. A data bit of the anti-fuse cell is programmed when a voltage difference between the control gate and the drain P+ diffusion exceeds a voltage threshold of the oxide layer and forms a leakage path from the control gate to the drain P+ diffusion. The leakage path is confined to occur in the overlapping region.

20 Claims, 10 Drawing Sheets

Related U.S. Application Data continuation of application No. 15/707,967, filed on Sep. 18, 2017, now Pat. No. 10,109,363, which is a continuation of application No. 15/096,170, filed on Apr. 11, 2016, now Pat. No. 9,793,001.

(60) Provisional application No. 62/262,881, filed on Dec. 3, 2015, provisional application No. 62/146,373, filed on Apr. 12, 2015.

(51) Int. Cl.
    *H01L 27/088*     (2006.01)
    *H01L 27/12*     (2006.01)
    *H01L 27/092*     (2006.01)

(52) U.S. Cl.
    CPC ...... *H01L 27/0886* (2013.01); *H01L 27/0924* (2013.01); *H01L 27/11206* (2013.01); *H01L 27/1211* (2013.01)

(58) Field of Classification Search
    USPC .......................................................... 365/96
    See application file for complete search history.

(56) References Cited

U.S. PATENT DOCUMENTS

| | | |
|---|---|---|
| 2004/0207100 A1 | 10/2004 | Madurawe |
| 2006/0092742 A1 | 5/2006 | Paillet |
| 2008/0237788 A1 | 10/2008 | Perkins |
| 2009/0091368 A1 | 4/2009 | Banerjee |
| 2009/0207655 A1 | 8/2009 | Kalnitsky et al. |
| 2009/0250726 A1 | 10/2009 | Kurjanowicz |
| 2011/0108926 A1 | 5/2011 | Bahl |
| 2011/0110161 A1* | 5/2011 | Lee .................. G11C 16/3418 365/185.18 |
| 2011/0121366 A1* | 5/2011 | Or-Bach ............ H01L 21/6835 257/204 |
| 2011/0176368 A1 | 7/2011 | Kalnitsky et al. |
| 2011/0205218 A1 | 8/2011 | Tsuchi |
| 2011/0269286 A1 | 11/2011 | Zuniga et al. |
| 2012/0044743 A1 | 2/2012 | Chung |
| 2012/0061765 A1* | 3/2012 | Xu ..................... H01L 27/0629 257/369 |
| 2013/0010518 A1 | 1/2013 | Lu et al. |
| 2013/0294140 A1 | 11/2013 | Oh et al. |

OTHER PUBLICATIONS

Written Opinion of the International Searching Authority, dated Jul. 22, 2016, for corresponding International Application No. PCT/US2016/026986.

China Office Action, dated Feb. 3, 2020, for corresponding China Application No. 201680034443.X, pp. 1-19.

\* cited by examiner

|  | SG 201 (sel/des) | CG 202 | BL 209 (sel/des) | N-well 210 |
|---|---|---|---|---|
| Program 1 | 0V(-1V)/3V | 5V | 0V/3V | 3V |
| Program 2 | -2V/1V | 3V | -2V/1V | 1V |
| Program 3 | 0V/3V | -2V | 3V/0V | 3V |
| Program 4 | 0V(-1V)/3V | 5V | 0V/3V | 5V |

FIG. 2C

|  | SG 201 (sel/des) | CG 202 | BL 209 (sel/des) | N-well 210 |
|---|---|---|---|---|
| Read 1 | 0V/3V | 3V | 1V/FL | 3V |
| Read 2 | 0V/3V | 0V | 1V/FL | 3V |

FIG. 2D

|  | SG 701 (sel/des) | CG 702 | BL 709 (sel/des) | P-well 710 |
|---|---|---|---|---|
| Program 1 | 5V/0V | 0V | 5V/2V | 0V |
| Program 2 | 3V/0V | -2V | 3V/0V | 0V |

FIG. 7C

|  | SG 701 (sel/des) | CG 702 | BL 709 (sel/des) | P-well 710 |
|---|---|---|---|---|
| Read 1 | 3V/0V | 0V | 1V/FL | 0V |

FIG. 7D

CMOS ANTI-FUSE CELL

PRIORITY

This application is a continuation application of a U.S. patent application having application Ser. No. 16/143,346, filed on Sep. 26, 2018, and entitled "A CMOS Anti-Fuse Cell", and having a U.S. Pat. No. 10,395,744, which is a continuation application of U.S. patent application having application Ser. No. 15/707,967, filed on Sep. 18, 2017, entitled "A CMOS Anti-Fuse Cell", and having a U.S. Pat. No. 10,109,363, which is a continuation application of a U.S. patent application having application Ser. No. 15/096,170, filed on Apr. 11, 2016, entitled "A CMOS Anti-Fuse Cell," and having a U.S. Pat. No. 9,793,001, which further claims the benefit of priority based upon U.S. Provisional Patent Application having Application No. 62/146,373, filed on Apr. 12, 2015, and entitled "Anti-fuse Cell Based on Standard CMOS Logic Process," and U.S. Provisional Patent Application having Application No. 62/262,881, filed on Dec. 3, 2015, and entitled "Anti-fuse Cell Based on Standard CMOS Logic Process," all of which are hereby incorporated herein by reference in their entireties.

FIELD OF THE INVENTION

The exemplary embodiments of the present invention relate generally to the field of semiconductors and integrated circuits, and more specifically to memory and storage devices.

BACKGROUND OF THE INVENTION

Anti-fuse cell technology using a standard CMOS logic process is attractive due to its low manufacturing cost especially for embedded memory applications. The conventional anti-fuse cell using an NMOS device has low-cost, is easy-to-shrink, and provides high-density for advanced process nodes. Therefore, it is a good choice over other embedded memory devices, such as the flash memory. However, conventional anti-fuse cells do have several limitations. For example, because the anti-fuse cell can be programmed only one time, it is not suitable for systems that require re-programmability. To compensate for being only one-time programmable, conventional anti-fuse cells use multiple spare anti-fuse array blocks, which increase the overall die size and cost. Additionally, conventional anti-fuse cells may require isolation regions between cells due to the way the cells are programmed. This additional isolation may also increase the overall array size.

FIG. 1A shows a top view of a conventional N-channel anti-fuse cell structure 100 based on a standard CMOS logic process. The cell structure 100 includes a polysilicon select gate (SG) 101, a polysilicon control gate (CG) 102, N+ diffusions 103, a bit line contact 104, and a field isolation 105, such as a STI (Shallow-Trench-Isolation) oxide. A cross section indicator 111 is also shown.

FIG. 1B shows a cross section view of the cell structure 100. The cross section view is taken at cross section indicator 111 and further shows N+ diffusions 103*a*, 103*b*, and 103*c*, P− well 110, and gate oxides 106 and 107. In this cross section view, a metal bit line (BL) 109 connected to the bit line contact 104 has been added. The CG 102 and the N+ diffusions (103*b* and 103*c*) form transistor 113, which may be a low voltage device, such as a 3V device. The transistor 112 is similarly formed.

During programming of the transistor 113, a 5V signal is applied to the CG 102, a 0V signal is applied to the bit line 109, and VDD (e.g., 3V) is applied to the SG 101. The 5V signal applied to the CG may be applied from 5V I/O devices that are normally available in a standard CMOS logic process. With these bias conditions, 0V passes from the BL 109 to the N+ diffusion 103*b*. The 5V signal applied to the CG 102 will turn on the channel of transistor 113 and allow 0V to pass to the channel region 114. Because the voltage difference between the CG 102 and channel region 114 exceeds the breakdown voltage of the gate oxide 107, the gate oxide 107 will rupture (or breakdown) and cause the CG 102 to be shorted to the channel region 114 (this is referred to as 'on-cell'). Thus, transistor 113 is programmed as an "on-cell."

Meanwhile, the 3V signal is applied to cells associated with other (or unselected) bit lines (not shown). This 3V signal will be passed to the channel regions of these unselected cells. This prevents the voltage difference between the CGs and associated channels of these unselected cells from exceeding the gate oxide breakdown voltage, and thus the gate oxides of these unselected cells will not be ruptured (this is referred to as 'off-cell').

During a read operation, a positive voltage, such as 3V, is applied to the CG 102 and the BL 109 is biased at a lower voltage, such as 1V. If the cell (e.g., transistor 113) is an on-cell, current will flow from the CG 102 through the gate oxide breakdown region and to the BL 109. If the cell is an off-cell, there will be no current flowing.

When the channel 114 is turned on during programming of transistor 113, the oxide breakdown may occur at any location along the channel 114, such as breakdown path 108*a* near the drain of transistor 113, breakdown path 108*b* in the middle of the channel 114, or breakdown path 108*c* near the source of transistor 113. The location of the breakdown path is dependent on where the oxide 107 is defective.

During a read operation, the channel 114 must be turned on to allow the leakage current to flow from CG 102 though the channel 114 to the drain diffusion 103*b*. Since the breakdown may occur in the middle of the channel 114 (e.g., 108*b*) or near the source side diffusion 103*c* (e.g., 108*c*), the source diffusion 103*c* must be isolated from the adjacent cell by the field isolation 105. Otherwise, if the selected cell (e.g., transistor 113) is an off-cell but the adjacent cell is on-cell that has an oxide breakdown path near the source diffusion 103*c*, current may flow from the adjacent cell to the selected cell and cause a read error. This condition may occur even if the adjacent cells' channel is turned off.

Moreover, during a program operation, because the selected cell's CG channel is turned on, the adjacent cell's CG voltage may leak to the selected cell and cause a programming failure. As a result, the cell's source region 103*c* must be isolated to prevent these situations. However, the extra field isolation region (e.g., region 105) increases the cell size. It should also be noted that because the cell's channel is on during programming, the gate oxide breakdown may occur in different locations, and therefore different on-cell currents may result due to the different channel resistances that result. There may also be different cell characteristic resulting from different manufacturing processes and/or foundries.

It is therefore desirable to have an anti-fuse cell with uniform and less process dependent on-cell current and which avoids the use of additional isolation between cells to reduce size and cost.

SUMMARY

In various exemplary embodiments a novel anti-fuse cell structure is disclosed with uniform and less process dependent on-cell current and which avoids the use of additional isolation between cells to reduce size and cost. The cell can be manufactured using a standard CMOS logic process resulting in reduced cost for embedded memory applications.

In one aspect, an apparatus includes an N− well and an anti-fuse cell formed on the N− well. The anti-fuse cell includes a drain P+ diffusion deposited in the N− well, a source P+ diffusion deposited in the N− well, an oxide layer deposited on the N− well and having an overlapping region that overlaps the drain P+ diffusion. A control gate deposited on the oxide layer. A data bit of the anti-fuse cell is programmed when a voltage difference between the control gate and the drain P+ diffusion exceeds a voltage threshold of the oxide layer and forms a leakage path from the control gate to the drain P+ diffusion. The leakage path is confined to occur in the overlapping region.

In another aspect, a method is provided for operating an anti-fuse cell comprising a drain P+ diffusion deposited in an N− well, a source P+ diffusion deposited in the N− well, an oxide layer deposited on the N− well and having a first overlapping region that overlaps the drain P+ diffusion and a second overlapping region that overlaps the source P+ diffusion, and a control gate deposited on the oxide layer. The method comprises applying a first voltage to the control gate to turn off a channel region of the anti-fuse cell. The method also comprises applying a second voltage to the drain P+ diffusion wherein a first bit of the anti-fuse cell is programmed when a voltage difference between the first and second voltages exceeds a voltage threshold of the oxide layer and forms a leakage path from the control gate to the drain P+ diffusion. The leakage path is confined to occur in the first overlapping region.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 2A-D show exemplary embodiments of a novel anti-fuse cell structure and associated bias conditions;

FIGS. 7A-D show alternative exemplary embodiments of an anti-fuse cell structure and associated bias conditions.

DETAILED DESCRIPTION

Exemplary embodiments of the present invention are described herein in the context of a process, device, method, and apparatus for providing an anti-fuse cell device.

Those of ordinary skill in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

FIGS. 2A-D show exemplary embodiments of a novel anti-fuse cell and associated bias conditions.

Figure 2A:
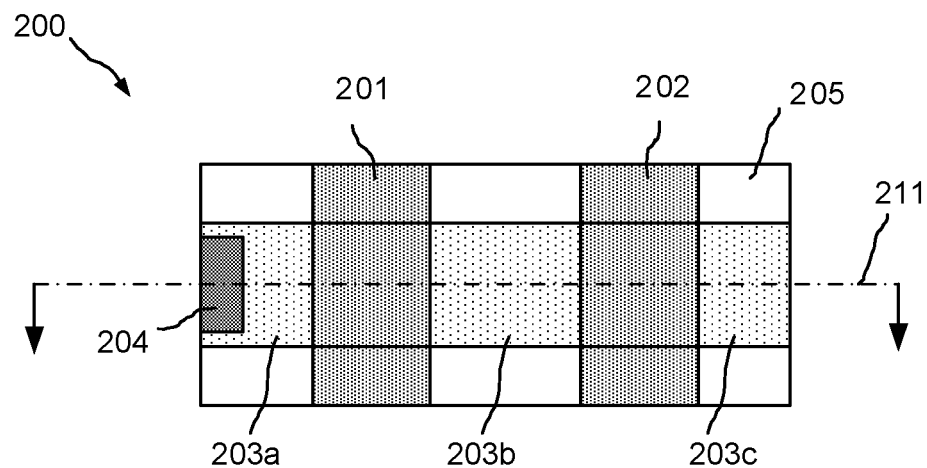

FIG. 2A shows a top view of an exemplary embodiment of a CMOS anti-fuse cell structure 200. The cell structure 200 includes a polysilicon SG 201, a polysilicon CG 202, P+ diffusions 203, a bit line contact 204, and a field isolation 205, such as STI (Shallow-Trench-Isolation) oxide. A cross section indicator 211 is also shown.

Figure 2B:
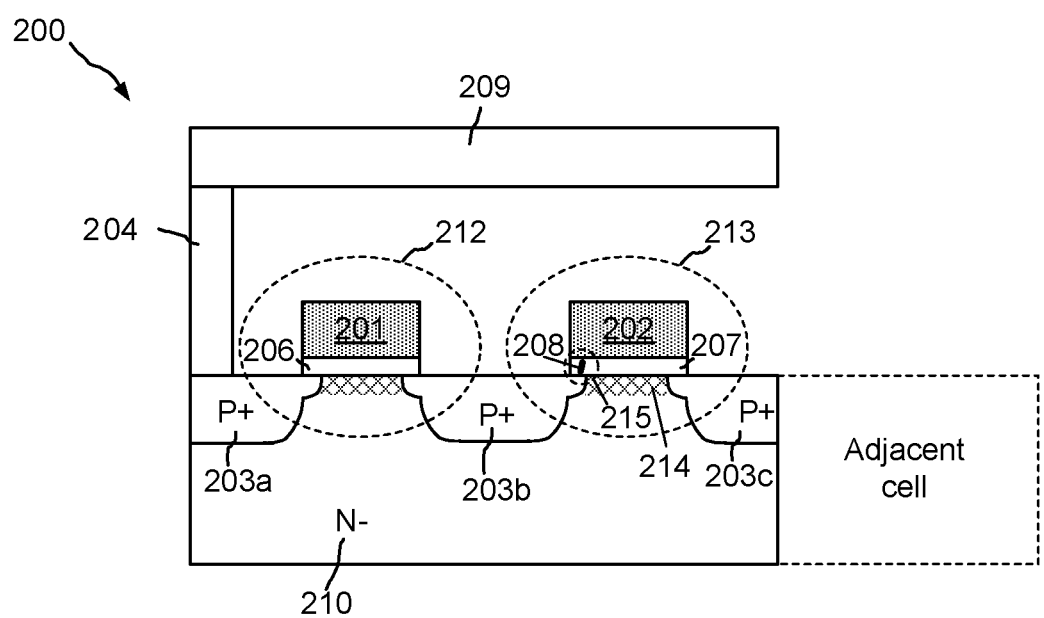

FIG. 2B shows a cross section view of the cell structure 200. The cross section view is taken at cross section indicator 211 and further shows P+ diffusions 203a, 203b, and 203c, gate oxides 206 and 207, and N− well 210. In this cross section view, a metal BL 209 connected to the bit line contact 204 has been added. The CG 202 and the P+ diffusions (203b and 203c) form transistor 213, which may be a low voltage device, such as a 3V device. The transistor 212 is similarly formed.

During programming, a positive voltage is applied to the select CG 202 that is higher than the breakdown voltage of the gate oxide 207, such as 5V to 7V. For simplicity and clarity of the following description, a 5V signal will be used as example. The 5V may be derived from 5V I/O devices that are normally available in standard CMOS logic processes. In this way, no extra high voltage device is required, this can be referred to as 'zero-cost added' technology. A low voltage signal is applied to the BL 209, such as 0V for example, and the SG 201 is also supplied with 0V to pass 0V from the BL 209 to the P+ diffusion 203b. The passed voltage may become approximately 1V due to the PMOS threshold voltage drop. In another embodiment, the SG 201 may be supplied with a negative voltage (such as −1V) to fully pass 0V to the P+ diffusion 203b. However, this may require that negative charge pump circuitry be added.

Because CG 202 is supplied with 5V, it will turn off the channel 214 of transistor 213. The voltage difference between the CG 202 and drain P+ diffusion 203b exceeds the breakdown voltage of the gate oxide 207. Since the channel 214 is off, the gate oxide 207 in the overlapping region 215 of the CG 202 and the drain P+ diffusion 203b will breakdown and cause a short 208 between the CG 202 and the drain P+ diffusion 203b. Thus, the cell is programmed and referred to as an 'on-cell'. It should be noted that due to the channel region 214 being turned off, it will remain at the voltage of N-well 210, such as 3V, and thus the breakdown of the gate oxide 207 will not happen in the channel region 214 so that the breakdown is confined to the overlapping region 215 of the CG 202 and the drain P+ diffusion 203b.

Meanwhile, unselected bit lines are supplied with 3V that will be passed to the drain P+ diffusions of the unselected cells. This reduces the voltage difference between the CG and the drain P+ diffusions of the unselected cells to be only 2V. Thus, the gate oxide of the unselected cells will not breakdown and the cells remains as 'off-cells'.

In an exemplary embodiment, because the cell's channel is turned off during programming, the cell does not need field isolation on its source side. For example, the cell does not need the additional field isolation 105 shown in FIG. 1B. This reduces the cell size by approximately 20% when compared to conventional cells that use the additional field isolation.

For the unselected CGs, they can be either connected to 0V, 3V, 5V, or floating. When supplied with 0V, 3V, or floating, since the voltage does not exceed the gate oxide's breakdown voltage, it will not cause the oxide breakdown. When it is supplied with 5V, because the cell's channel is turned off, the channel remains at the N-well's voltage level such as 3V, thus the cell's gate oxide will not breakdown. This is condition is advantageous because it allows all the CGs to be connected together. This eliminates the need for a CG decoder, which significantly saves silicon area especially since the CG decoder has to be made of 5V devices.

During a read operation, the CG 202 is supplied with a positive voltage, such as 3V, and the BL 209 is biased at a lower voltage, such as 1V. The SG 201 is supplied with 0V. If the cell (e.g., transistor 213) is an on-cell, a current that can be detected will flow from the CG 202 to the BL 209. If the cell is an off-cell, there will be no current flowing. Since this read condition turns off the channel region 214 of the cell (e.g., transistor 213), the cell will not be affected by the adjacent cell through the source P+ diffusion 203c. It should also be noted that there are more than one set of bias conditions that may be supplied to the disclosed cell structure in accordance with the exemplary embodiments.

FIG. 2C shows an exemplary table of bias conditions that may be used to program the novel anti-fuse cell shown in FIG. 2B. The bias conditions assume the use of 3V devices. As illustrated in FIG. 2C, in Program 1 the SG 201 is supplied with 0V or −1V to select the anti-fuse cell 213, and 3V to deselect. When the cell 213 is selected, the CG 202 is supplied with 5V and the BL 209 is supplied with 0V to program the "on-cell" condition. In Program 2, the SG 201 is supplied with −2V to select the anti-fuse cell 213, and 1V to deselect. When the cell 213 is selected, the CG 202 is supplied with 3V and the BL 209 is supplied with −2V to program the "on-cell" condition. In Program 3, the cell's channel is turned on during programming and thus may be less preferred. For example, in Program 3 the SG 201 is supplied with 0V to select the anti-fuse cell 213, and 3V to deselect. When the cell 213 is selected, the CG 202 is supplied with −2V and the BL 209 is supplied with 3V to program the "on-cell" condition. In Program 4 a 5V junction breakdown is used, which may be implemented by using a 5V device's source and drain implant or (Lightly Doped Drain) LDD implant in a 3V device. For example, in Program 4 the SG 201 is supplied with 0V or −1V to select the anti-fuse cell 213, and 3V to deselect. When the cell 213 is selected, the CG 202 is supplied with 5V and the BL 209 is supplied with 0V to program the "on-cell" condition.

FIG. 2D shows an exemplary table of bias conditions that may be used to read the novel anti-fuse cell shown in FIG. 2B. The Read 1 bias conditions are preferred since the Read 2 bias conditions will turn on the cell's channel, which is less preferred. In Read 1, the SG 201 is supplied with 0V to select the anti-fuse cell 213, and 3V to deselect. When the cell 213 is selected, the CG 202 is supplied with 3V and the BL 209 is supplied with 1V to read the cell 213. For example, if the cell 213 is an "on-cell" current will flow from the CG 202 to the BL 209 when the Read 1 bias conditions are applied. In Read 2, the SG 201 is supplied with 0V to select the anti-fuse cell 213, and 3V to deselect. When the cell 213 is selected, the CG 202 is supplied with 0V and the BL 209 is supplied with 1V to read the cell 213. For example, if the cell 213 is an "on-cell" current will flow from the CG 202 to the BL 209 when the Read 2 bias conditions are applied.

It should be noted that the voltages shown in the tables are exemplary and that other suitable voltages may be used depending on the technologies and processes. For example, in another embodiment using 1.8V technology, the cell may be made of 1.8V devices, and the CG 202 may be supplied with 3V to breakdown the cell's gate oxide for programming. The CG voltage may be supplied by 3V I/O devices. Also notice, according to the invention, the CG 202 may have the same or a different channel length as the SG 201. Moreover, the devices may or may not have double-side or single-side LDD (Lightly Doped Drain), Halo implantation, or any other features that usually applied to the CMOS process. Moreover, although the CMOS logic process is preferred to realize zero-cost added embedded memory solution, it is obvious the exemplary embodiments of the invention can be applied to any other processes such as SOI, FinFET, BiCMOS, and many others. The above descriptions are applicable to all the embodiments in accordance with the invention. For simplicity, they will not be repeated in this description.

Figure 3A:
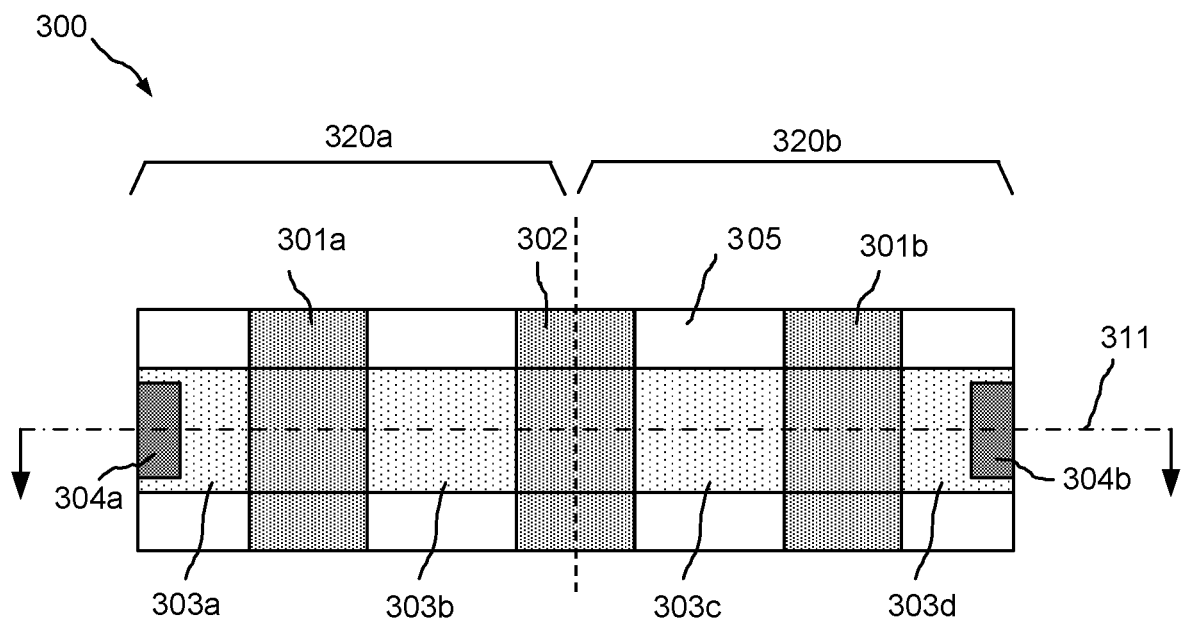
FIGS. 3A-B show exemplary embodiments of a novel anti-fuse cell structure that enables two bits to be programmed in one cell.
Figure 3B:
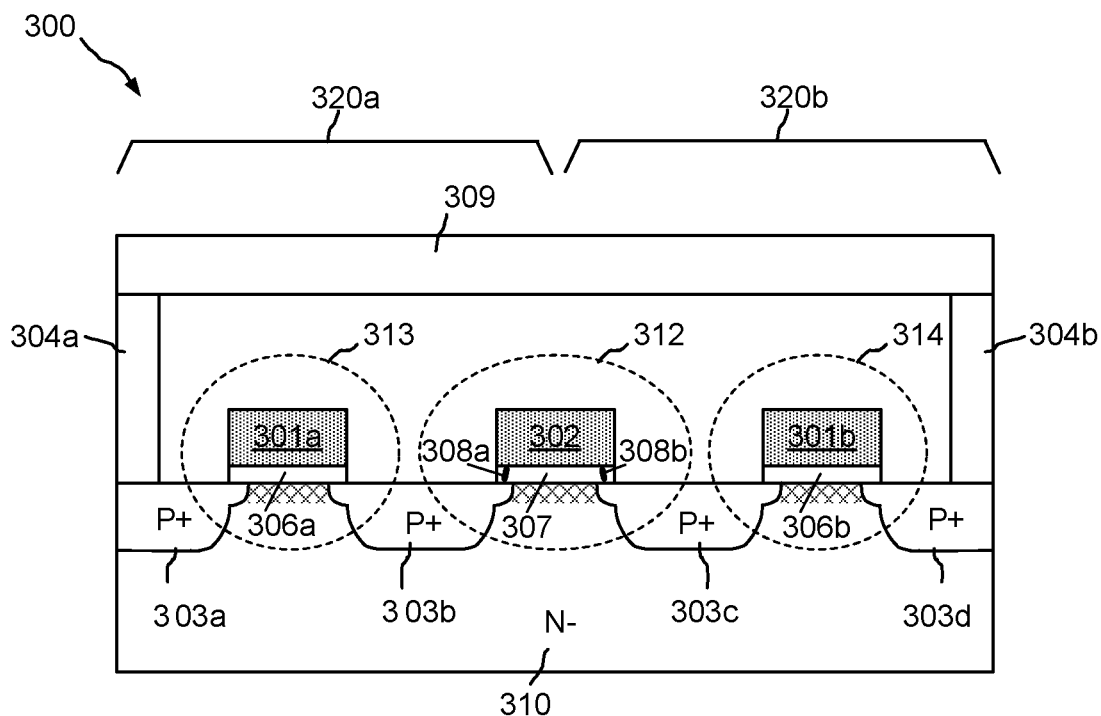

FIGS. 3A-B shows exemplary embodiments of a novel anti-fuse cell structure 300 that enables two bits to be programmed in one cell.

FIG. 3A shows a top view of the novel anti-fuse cell structure 300. In the exemplary embodiment shown in FIG. 3A, two cells 320a and 320b are shown. The cell structure 300 includes polysilicon SGs 301a and 301b, a polysilicon CG 302, P+ diffusions 303, bit line contacts 304a and 304b and field isolation 305, such as STI (Shallow-Trench-Isolation) oxide. The cells in FIG. 3A have a structure that is similar to the cell shown in FIG. 2A except the cells 320a and 320b share the CG 302. A cross section indicator 311 is also shown.

FIG. 3B shows a cross section view of the cell structure 300. The cross section view is taken at cross section indicator 311 and further shows the P+ diffusions 303a, 303b, 303c, and 303d, gate oxides 306a, 306b, and 307, and N− well 310. In this cross section view, a metal BL 309 connected to the bit line contacts 304b and 304b has been added. The CG 302 and the P+ diffusions (303b and 303c) form transistor 312, which may be a low voltage device, such as a 3V device. The transistors 313 and 314 are similarly formed.

To program the cell 320a, the CG 302 is supplied with 5V, the SG 301a is supplied with 0V, and BL 309 is supplied with 0V. This turns off the channel of transistor 312 and confines the gate oxide 307 to breakdown (as shown at 308a) in the overlapping region of the CG 320 and drain P+ diffusion 303b. Meanwhile, the unselected SG 301b is supplied with 3V to turn off the transistor 314. The drain P+ diffusion 303c remains floating at 3V and thus based on the small voltage difference between the CG 302 and drain P+ diffusion 303c the gate oxide 307 will not breakdown due to this voltage differential.

Similarly, to program the cell 320b, the SG 301b is turned on to pass 0V from the BL 309 to the diffusion 303c, which results in a voltage difference that causes the gate oxide 307 in the overlapping region of the CG 302 and drain P+ diffusion 303c to breakdown as illustrated at 308b. Since the channel of the transistor 312 is off, the oxide breakdown is confined to the overlapping region of the CG 302 and drain P+ diffusion 303c. Meanwhile, the SG 301a is turned off so the cell 320a will not be affected. It should be noted that there are many sequences with which to apply the programming biases. For example, in one embodiment, the CG 302 and the BL 309 are supplied with 3V, and then the SG 301a and SG 301b are supplied with 0V to pass 3V to the drain diffusions 303a and 303b, etc. Then, the BL 309 and the SG 301a are supplied with 0V, and then the selected CG (or all CG in another embodiment) is raised from 3V to 5V to effectuate programming.

It should be noted that the above-described method is just one example for programming two bits in the novel anti-fuse cell structure. It will be obvious to one with skill in the art that many different methods may be used with the various exemplary embodiments.

During a read operation, the CG 302 is supplied with a positive voltage, such as 3V for example. The selected SG is supplied with 0V and the unselected SG is supplied with 3V. If the selected cell is an on-cell, the current will flow from the CG 302 to the BL 309. If the cell is an off-cell, there will be no current flowing. It should be noted that during both program and read operations, because the CG 302 is turned off, the two cells can be programmed and read independently without affecting each other. Since two on-cell states can be programmed using only three devices, this embodiment reduces cell size by approximately 36% when compared with conventional anti-fuse devices.

Figure 4A:
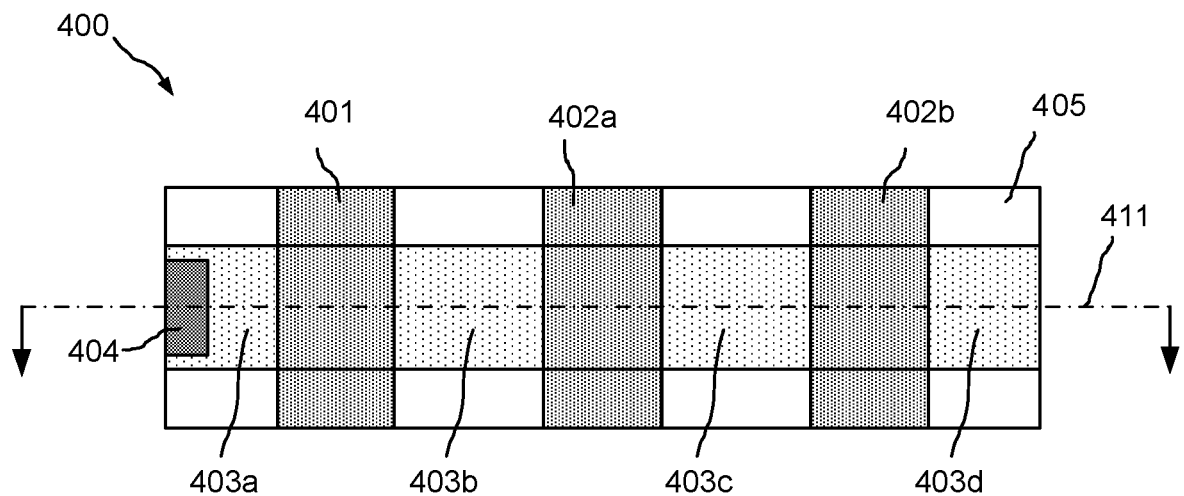
FIGS. 4A-B shows exemplary embodiments of a novel anti-fuse cell structure that utilizes additional cells to provide programmability.
Figure 4B:
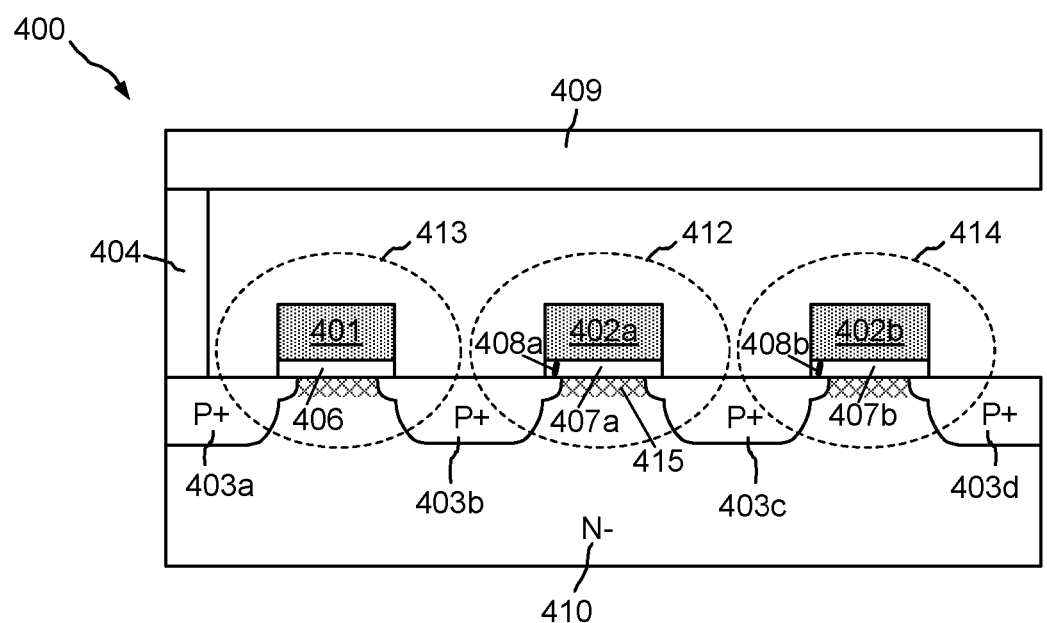

FIGS. 4A-B shows exemplary embodiments of a novel anti-fuse cell structure 400 that utilizes additional cells to provide programmability.

FIG. 4A shows a top view of the novel anti-fuse cell structure 400. This embodiment allows the anti-fuse cell to be programmed more than one time. This function is important because typical anti-fuse cells can be programmed one time only. If a system needs re-programmability, conventional systems contain multiple 'spare' array blocks that result in higher costs and a large increase in array area. The embodiment shown in FIG. 4A does not use additional array blocks and therefore has lower cost and smaller array area when compared to conventional devices.

In the exemplary embodiment shown in FIG. 4A, the cell 400 includes a select gate 401 and multiple control gates 402a and 402b, P+ diffusions 403, bit line contact 404 and field isolation 405, such as STI (Shallow-Trench-Isolation) oxide. A cross section indicator 411 is also shown.

FIG. 4B shows a cross section view of the cell structure 400. The cross section view is taken at cross section indicator 411 and further shows the P+ diffusions 403a, 403b, 403c, and 403d, gate oxides 408a, 408b, and 406, and N− well 410. In this cross section view, a metal BL 409 connected to the bit line contact 404 has been added. The CG 402a and the P+ diffusions (403b and 403c) form transistor 412, which may be a low voltage device, such as a 3V device. The transistors 413 and 414 are similarly formed.

In an exemplary embodiment, the cell 400 can be programmed multiple times without increasing the size of the array multiple times as in conventional devices. For example, assuming both cells 412 and 414 are not programmed, the cell 414 can be programmed by supplying the BL 409 with 0V and supplying the SG 401 and CG 402a with 0V. This will pass 0V to the drain P+ diffusion 403c. The CG 402b is supplied with 5V, which turns off its channel region. This will cause the gate oxide in 407b to breakdown (as shown at 408b) in the overlapping region between the CG 402b and the P+ diffusion 403c due to the voltage difference. Thus, the cell 414 is programmed to be an on-cell.

To read the cell (414), the SG 401 and CG 402a are supplied with 0V and the CG 402b is supplied with 3V. If the cell 414 is an on-cell, current will flow from the CG 402b to the BL 409. If the cell (414) is not programmed, there will be no current flow to the BL 409.

In the event that the data needs to be updated, the new data can be programmed into the cell (412) and the cell (414) can be disabled. To program cell (412), the BL 409 and SG 401 are supplied with 0V and the CG 402a is supplied with 5V. These conditions will turn off the channel associated with transistor 412 and cause the gate oxide 407a to breakdown (as shown at 408a) in the overlapping region between the CG 402a and the P+ diffusion 403b due to the voltage difference. To read the cell (412), the SG 401 is supplied with 0V and CG 402a is supplied with 3V. Under these conditions, current will flow from CG 402a to the BL 409 if it is an on-cell, otherwise no current will flow to the BL 409.

It should be noted that since the channel 415 of cell (412) is turned off during both program and read operations, the data of the cell (414) will not affect the cell (412). It should further be noted that in various exemplary embodiments, the programming sequence is conducted by programming the cell located furthest from the BL contact 404, which in this case is cell 414. Then, reprogramming can occur by programming the cell adjacent to the programmed cell moving toward the BL contact 404, which in this case in cell 412. Once the cell 412 is programmed, the cell 414 will not be able to be read correctly and therefore can be disabled. Thus, the cells are programmed in sequence from the furthest to the closest moving toward the BL contact 404. Although the exemplary cell structure shown in FIGS. 4A-B contains two cells (e.g., 412 and 414), it is obvious that the cell structure may be extended to contain any number of cells and exhibit the same novel features.

Figure 5A:
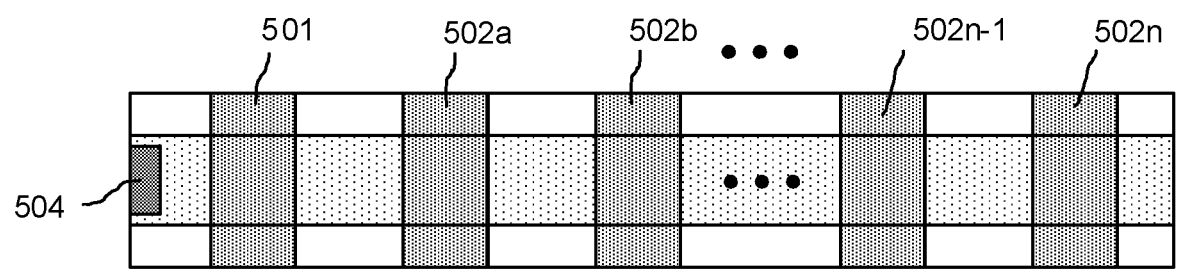
FIGS. 5A-B shows exemplary embodiments of anti-fuse cell structures that provide programmability.
Figure 5B:
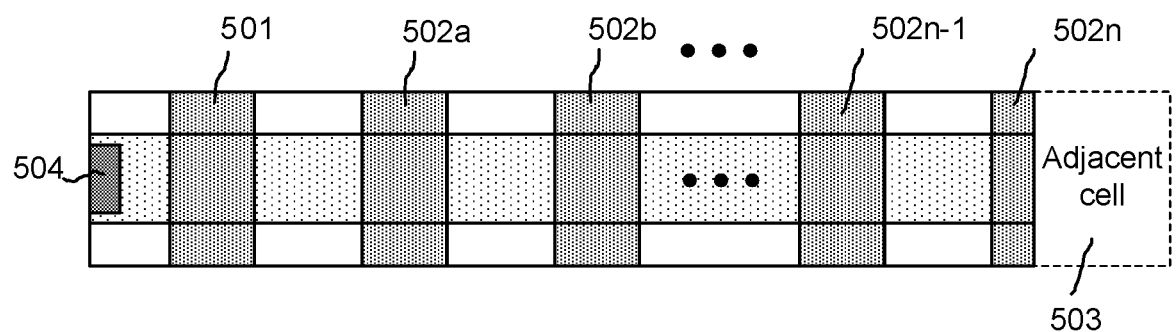

FIGS. 5A-B shows exemplary embodiments of anti-fuse cell structures that provide programmability.

FIG. 5A shows an exemplary embodiment of a cell structure that contains one SG 501 and multiple control gates 502a-n that are part of multiple anti-fuse cells. BL contact 504 is also shown. Thus, the cell structure of FIG. 5A may be used to provide multiple anti-fuse cell programming by programming cells associated with the control gates 502a-n. The programming order would be to start programming with cell 502n, and then when reprogramming is desired, to program cell 502n-1 and then cell 502n-2, etc. Thus, the cells are programmed starting with the cell furthest from the BL contact 504 and programming adjacent cells moving toward the BL contact 504.

FIG. 5B shows another exemplary embodiment of a cell structure that contains one SG 501, BL contact 504 and multiple control gates 502a-n. This cell structure is similar to that shown in FIG. 5A except the control gate 502n is shared with an adjacent cell 503 (not shown in detail) However, the sharing of the control gate 502n with an adjacent cell can be performed as described with reference to FIG. 3A-B.

It should be noted that in the embodiments shown in FIG. 5A-B, that although the cell structures according to the invention only require one SG, it is possible in other embodiments to utilize more than one SG. For example, in another embodiment, the device 502*n* may be used as source side SG such that the devices 502*a* to 502*n*-1 represent the novel anti-fuse cells.

Figure 6:
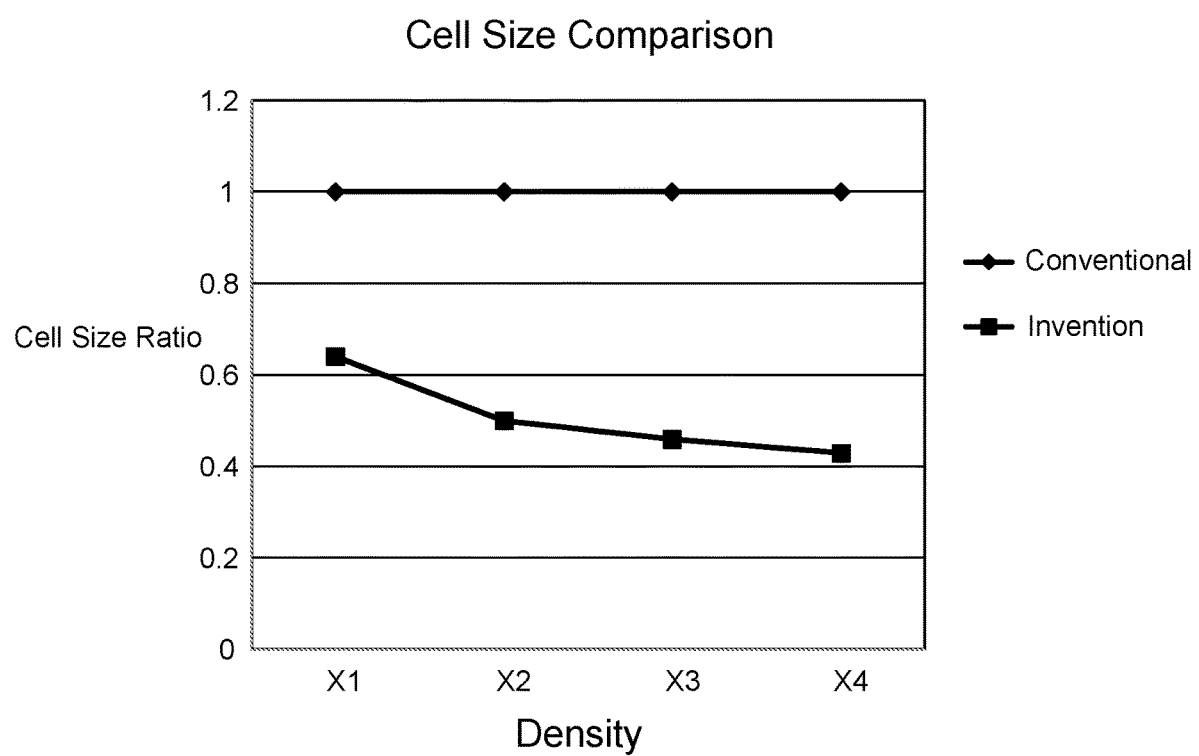
FIG. 6 shows an exemplary cell size comparison chart 600 that illustrates the cell size of conventional devices compared to the cell size of devices implemented with the novel anti-fuse cell structures shown in FIG. 5A-B.

FIG. 6 shows an exemplary cell size comparison chart 600 that illustrates the cell size of the conventional devices versus the cell size of devices implemented with the novel anti-fuse cell structure shown in FIG. 5A-B. The chart 600 shows that cell size can be reduced 36%, 50%, 54%, and 57%, with the cell structures constructed in accordance with the disclosed embodiments and containing 1 to 4 cells, respectively.

Figure 7A:
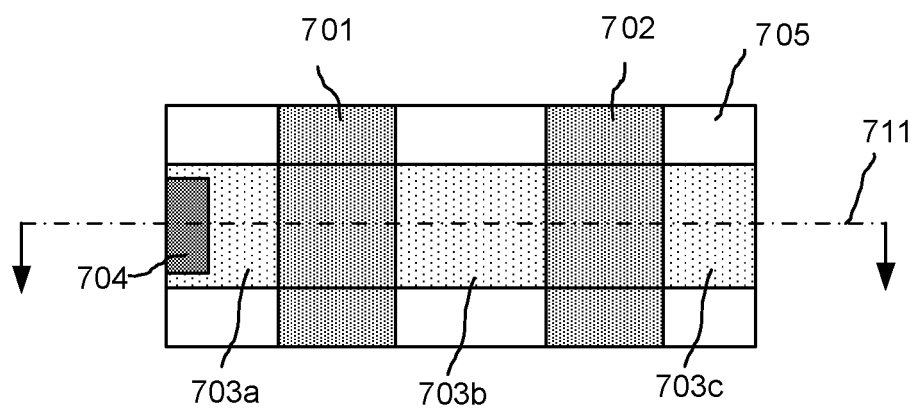
Figure 7B:
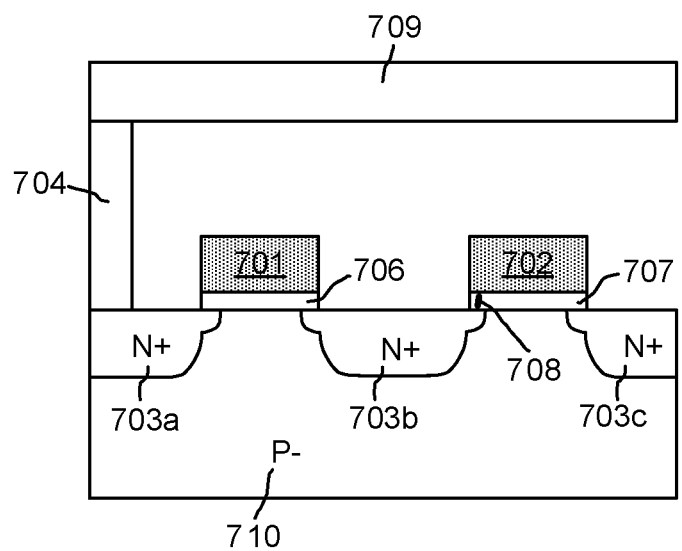

FIGS. 7A-D show alternative exemplary embodiments of an anti-fuse cell and associated bias conditions. As illustrated in FIG. 7A the cell structure is similar to that shown in FIG. 2A except that the P+ diffusions 203*a*, 203*b*, and 203*c* shown in FIG. 2A are changed to N+ diffusions 703 and the N− well 210 shown in FIG. 2B is changed to a P-well 710 as shown in FIG. 7B. As shown in FIG. 7B, the BL 709, BL contact 704, SG 701, CG 702, and oxides 706 and 707 correspond to those shown in FIG. 2B.

FIG. 7C shows a table that illustrates an exemplary embodiment of bias voltages used to program the anti-fuse cell shown in FIGS. 7A-B. It should be noted that unlike the conventional cell, the programming operations for the cell shown in FIGS. 7A-B turns off the cell's channel, and thus the gate oxide breakdown 708 is confined to occur in the overlapping region of the CG 702 and N+ diffusion 703*b*. This allows the cell to avoid having field isolation on the source side, and thus reduces the cell size.

As the table in FIG. 7C illustrates, the Program 1 bias conditions use a 5V junction breakdown voltage (e.g., voltage difference between CG 702 and BL 709), thus may not suitable for 3V or 1.8V devices. The Program 2 only requires a 3V junction breakdown voltage. However, the Program 2 needs the CG 702 to be supplied with a negative voltage, which may be generated by negative charge pump circuitry added to the device.

FIG. 7D shows a table that illustrates an exemplary embodiment of bias voltages used to read the anti-fuse cell shown in FIGS. 7A-B. Similarly to the anti-cell shown in FIGS. 2A-B, the CG 702 will turn off the cell's channel during this read condition. It should be noted that the bias conditions shown in FIGS. 7C-D turn off the NMOS cell's channel during program and read operations. Therefore, this implementation allows the cell structures shown above to also utilize NMOS devices. For simplicity, these embodiments are analogous to those described above and therefore will not be shown in the figures or described in greater detail.

Figure 1A:
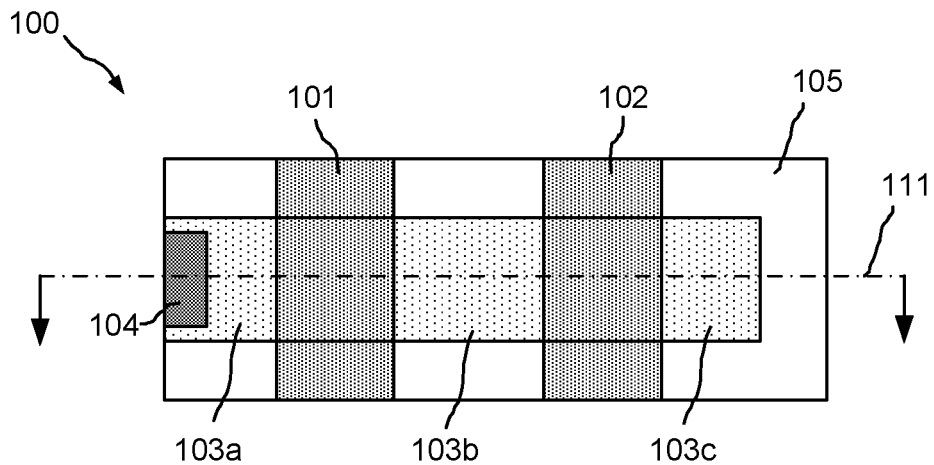
FIGS. 1A-B show a conventional anti-fuse cell structure.
Figure 1B:
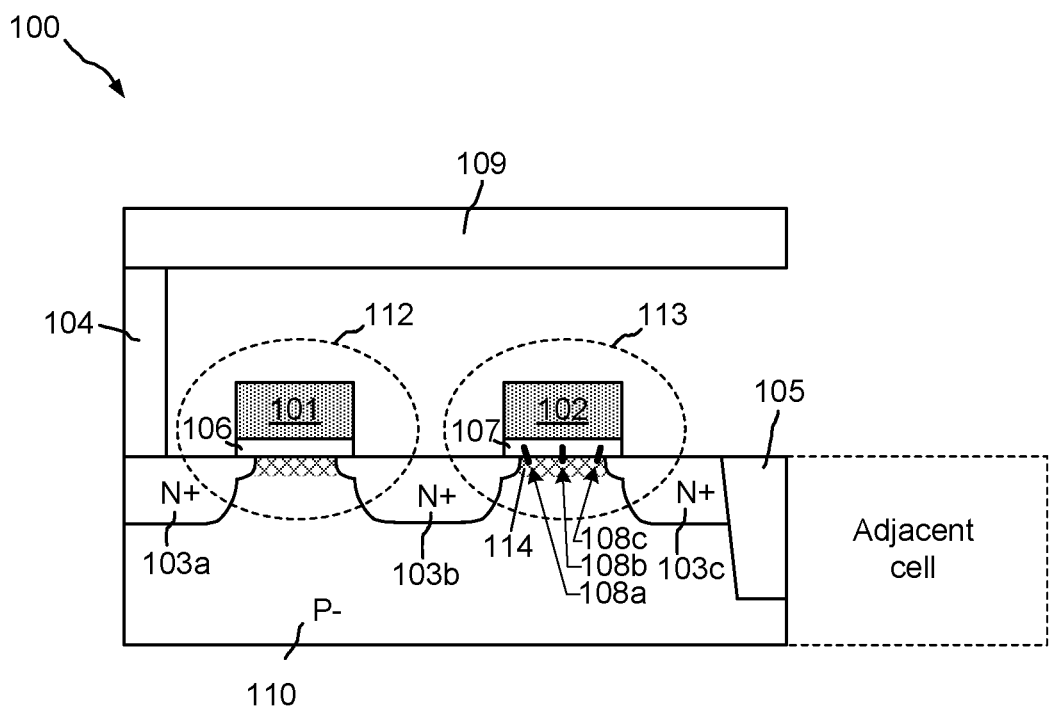

In an exemplary embodiment, the bias conditions of FIGS. 7C-D can be applied to the conventional device shown in FIGS. 1A-B. The bias conditions cause the gate oxide breakdown to be confined to occur in the overlapping region between the CG 102 and the drain diffusion 103*b*. Because the cell's channel is turned off, the gate oxide breakdown will not occur in the regions 108*b* or 108*c*. As a result, the cell current characteristics will become more uniform for different processes and foundries. For simplicity, these embodiments will not be shown in the figures or described herein, however, these applications shall remain within the scope of the invention.

Figure 8A:
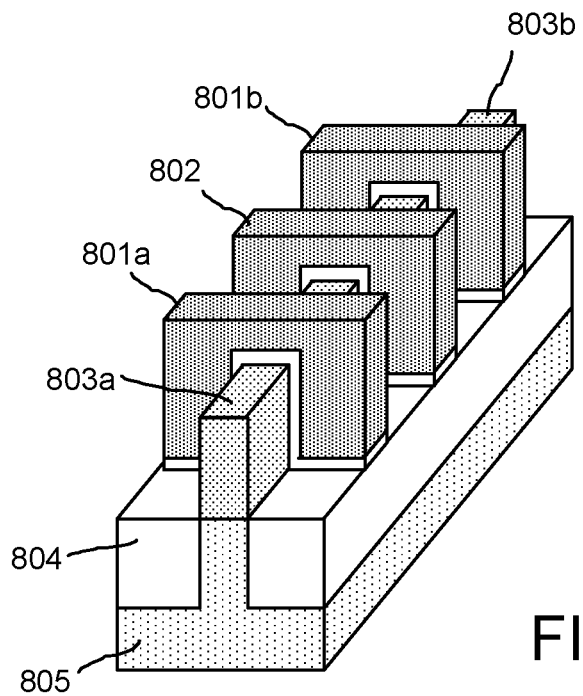
FIGS. 8A-B show exemplary embodiments of novel anti-fuse cell structures.
Figure 8B:
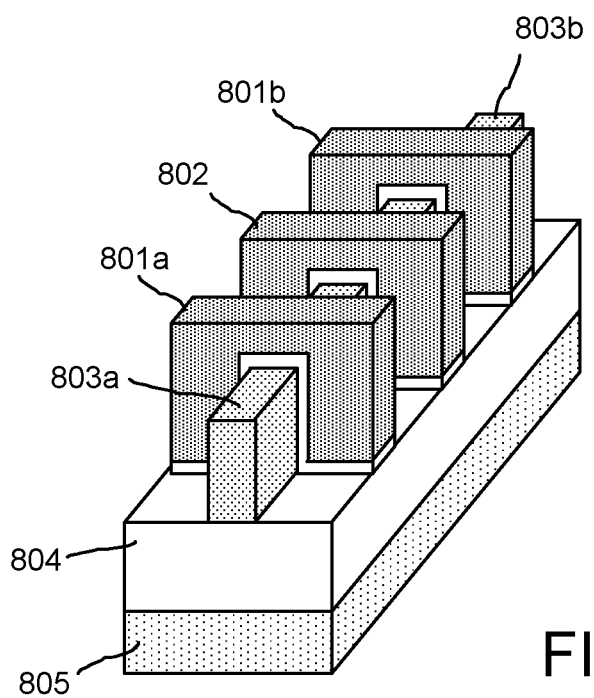

FIGS. 8A-B show exemplary embodiments of novel anti-fuse cell structures. FIG. 8A shows an anti-fuse cell structure implemented with a bulk FinFET process. FIG. 8B shows an anti-fuse cell structure implemented with a SOI FinFET process. The embodiments shown in FIGS. 8A-B include select gates 801*a* and 801*b* and control gate 802. The structures also include silicon fins 803*a* and 803*b* that connect to a metal bit line (not shown) on top of the cells. An insulator 804, such as STI, and a substrate 805 are also shown. It should be noted that in an exemplary embodiment, the cells may be implemented using traditional junction transistors, and in another exemplary embodiment, the cells may be junction-less transistors.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A multi-time programmable (MTP) anti-fuse apparatus, comprising:
   an N− well;
   a select gate (SG) transistor formed on the N− well and having a SG P+ drain diffusion coupled to a bit line and a SG P+ source diffusion;
   a plurality of one-time programmable (OTP) anti-fuse cells formed in series on the N− well, wherein each OTP anti-fuse cell includes an oxide layer deposited on the N− well, a control gate deposited on the oxide layer, a drain P+ diffusion deposited in the N− well and forming an overlapping region with the oxide layer, and a source P+ diffusion deposited in the N− well;
   wherein the drain P+ diffusion of a first OTP anti-fuse cell is coupled to the SG P+ source diffusion, and the source P+ diffusions of each remaining OTP anti-fuse cell are coupled to the drain P+ diffusions of adjacent OTP anti-fuse cells;
   wherein a selected OTP anti-fuse cell is programmed by enabling the select gate transistor and all OTP anti-fuse cells between the select gate transistor and the selected OTP anti-fuse cell, and applying programming conditions to the selected OTP anti-fuse cell; and
   wherein the MTP anti-fuse apparatus is reprogrammed when a second selected OTP anti-fuse cell that is located between the select gate transistor and the selected OTP anti-fuse cell is programmed by enabling the select gate transistor and all OTP anti-fuse cells between the select gate transistor and the second selected OTP anti-fuse cell, and applying programming conditions to the second selected OTP anti-fuse cell.

2. The apparatus of claim 1, wherein each OTP anti-fuse cell forms a PMOS transistor, and wherein the second selected OTP anti-fuse cell is read by enabling the select gate transistor and all OTP anti-fuse cells between the select gate transistor and the second selected OTP anti-fuse cell, and apply reading conditions to the second selected OTP anti-fuse cell.

3. The apparatus of claim 1, wherein each OTP anti-fuse cell is programmed when a voltage difference between the control gate and the drain P+ diffusion exceeds a voltage threshold of the oxide layer and forms a leakage path through the oxide layer that is confined to occur in the overlapping region.

4. The apparatus of claim 3, wherein the voltage threshold of the oxide layer is approximately 4 volts.

5. The apparatus of claim 1, wherein the selected OTP anti-fuse cell is at least one OTP anti-fuse cell away from the select gate transistor, and wherein the second selected OTP anti-fuse cell can be any OTP anti-fuse cell located between the select gate transistor and the selected OTP anti-fuse cell.

6. The apparatus of claim 1, wherein the selected OTP anti-fuse cell is programmed by:
applying 0 volts to the bit line, a gate terminal of the select gate transistor, and the control gates of all OTP anti-fuse cells between the select gate transistor and the selected OTP anti-fuse cell; and
applying 5 volts to the control gate of the selected OTP anti-fuse cell.

7. The apparatus of claim 6, wherein the MTP anti-fuse apparatus is reprogrammed by:
applying 0 volts to the bit line, the gate terminal of the select gate transistor, and the control gates of all OTP anti-fuse cells between the select gate transistor and the second selected OTP anti-fuse cell; and
applying 5 volts to the control gate of the second selected OTP anti-fuse cell.

8. The apparatus of claim 1, further comprising a second select gate transistor formed on the N– well and coupled to a last OTP anti-fuse cell and the bit line.

9. A method of operating a multi-time programmable (MTP) anti-fuse apparatus having an N– well, a select gate (SG) transistor formed on the N– well, the SG transistor having a SG P+ drain diffusion coupled to a bit line and a SG P+ source diffusion, the apparatus also having a plurality of one-time programmable (OTP) anti-fuse cells formed in series on the N– well, wherein each OTP anti-fuse cell includes an oxide layer deposited on the N– well, a control gate deposited on the oxide layer, a drain P+ diffusion deposited in the N– well and forming an overlapping region with the oxide layer, and a source P+ diffusion deposited in the N– well, and wherein the drain P+ diffusion of a first OTP anti-fuse cell is coupled to the SG P+ source diffusion, and the source P+ diffusions of each remaining OTP anti-fuse cell are coupled to the drain P+ diffusions of adjacent OTP anti-fuse cells, the method comprising:
applying a first voltage to the bit line;
applying a second voltage to a gate terminal of the control gate;
applying a third voltage to the control gates of all OTP anti-fuse cells between the select gate transistor and a selected OTP anti-fuse cell; and
applying a fourth voltage to the control gate of the selected OTP anti-fuse cell.

10. The method of claim 9, wherein the first, second, and third voltages are 0 volts, and the fourth voltage is five volts.

11. The method of claim 9, wherein the MTP anti-fuse apparatus is reprogrammed by performing operations of:
applying the first voltage to the bit line;
applying the second voltage to the gate terminal of the control gate;
applying the third voltage to the control gates of all OTP anti-fuse cells between the select gate transistor and a second selected OTP anti-fuse cell; and
applying the fourth voltage to the control gate of the second selected OTP anti-fuse cell.

12. The method of claim 11, wherein the first, second, and third voltages are 0 volts, and the fourth voltage is five volts.

13. A multi-time programmable (MTP) anti-fuse apparatus, comprising:
a P– well;
a select gate (SG) transistor formed on the P– well and having a SG N+ drain diffusion coupled to a bit line and a SG N+ source diffusion;
a plurality of one-time programmable (OTP) anti-fuse cells formed in series on the P– well, wherein each OTP anti-fuse cell includes an oxide layer deposited on the P– well, a control gate deposited on the oxide layer, a drain N+ diffusion deposited in the P– well and forming an overlapping region with the oxide layer, and a source N+ diffusion deposited in the P– well;
wherein the drain N+ diffusion of a first OTP anti-fuse cell is coupled to the SG N+ source diffusion, and the source N+ diffusions of each remaining OTP anti-fuse cell are coupled to the drain N+ diffusions of adjacent OTP anti-fuse cells;
wherein a selected OTP anti-fuse cell is programmed by enabling the select gate transistor and all OTP anti-fuse cells between the select gate transistor and the selected OTP anti-fuse cell, and applying programming conditions to the selected OTP anti-fuse cell; and
wherein the MTP anti-fuse apparatus is reprogrammed when a second selected OTP anti-fuse cell that is located between the select gate transistor and the selected OTP anti-fuse cell is programmed by enabling the select gate transistor and all OTP anti-fuse cells between the select gate transistor and the second selected OTP anti-fuse cell, and applying programming conditions to the second selected OTP anti-fuse cell.

14. The apparatus of claim 13, wherein each OTP anti-fuse cell forms an NMOS transistor, and wherein the second selected OTP anti-fuse cell is read by enabling the select gate transistor and all OTP anti-fuse cells between the select gate transistor and the second selected OTP anti-fuse cell, and apply reading conditions to the second selected OTP anti-fuse cell.

15. The apparatus of claim 13, wherein each OTP anti-fuse cell is programmed when a voltage difference between the control gate and the drain N+ diffusion exceeds a voltage threshold of the oxide layer and forms a leakage path through the oxide layer that is confined to occur in the overlapping region.

16. The apparatus of claim 15, wherein the voltage threshold of the oxide layer is approximately 4 volts.

17. The apparatus of claim 13, wherein the selected OTP anti-fuse cell is at least one OTP anti-fuse cell away from the select gate transistor, and wherein the second selected OTP anti-fuse cell can be any OTP anti-fuse cell located between the select gate transistor and the selected OTP anti-fuse cell.

18. The apparatus of claim 13, wherein the selected OTP anti-fuse cell is programmed by applying 5 volts to the bit line, a gate terminal of the select gate transistor, and the control gates of all OTP anti-fuse cells between the select gate transistor and the selected OTP anti-fuse cell, and applying 0 volts the control gate of the selected OTP anti-fuse cell.

19. The apparatus of claim 13, wherein the MTP anti-fuse apparatus is reprogrammed by applying 5 volts to the bit line, the gate terminal of the select gate transistor, and the control gates of all OTP anti-fuse cells between the select gate transistor and the selected OTP anti-fuse cell, and applying 0 volts to the control gate of the second selected OTP anti-fuse cell.

20. The apparatus of claim 13, further comprising a second select gate transistor formed on the P– well and coupled to a last OTP anti-fuse cell and the bit line.

* * * * *